United States Patent [19]

Baek et al.

[11] Patent Number: 5,696,719
[45] Date of Patent: Dec. 9, 1997

[54] SENSE AMPLIFIED OUTPUT CONTROL CIRCUIT

[75] Inventors: Dae Bong Baek, Kyungki-Do; Sung Hoon Kwak, Seoul, both of Rep. of Korea

[73] Assignee: LG Semicon Co., Ltd., Cheongju, Rep. of Korea

[21] Appl. No.: 702,372

[22] Filed: Aug. 23, 1996

[30] Foreign Application Priority Data

Dec. 28, 1995 [KR] Rep. of Korea ............... 62051/1995

[51] Int. Cl.⁶ ................... G11C 7/00; G11C 7/02
[52] U.S. Cl. ............ 365/189.05; 365/207; 365/208
[58] Field of Search ............... 365/189.05, 195, 365/196, 205, 207, 208

[56] References Cited

U.S. PATENT DOCUMENTS

| | | | |
|---|---|---|---|
| 4,616,148 | 10/1986 | Ochii et al. | 365/208 |
| 4,827,454 | 5/1989 | Okazaki | 365/233.5 |
| 5,138,577 | 8/1992 | Oh | 365/189.05 |
| 5,160,861 | 11/1992 | Lee | 365/206 |
| 5,311,471 | 5/1994 | Matsumoto et al. | 365/189.05 |
| 5,398,213 | 3/1995 | Yeon et al. | 365/189.05 |
| 5,402,387 | 3/1995 | Hotta et al. | 365/189.05 |
| 5,408,435 | 4/1995 | McClure et al. | 365/195 |
| 5,455,795 | 10/1995 | Nakao et al. | 365/189.05 |
| 5,515,323 | 5/1996 | Yamazaki et al. | 365/189.05 |
| 5,530,995 | 7/1996 | Kaneko | 365/189.05 |

Primary Examiner—David C. Nelms
Assistant Examiner—Trong Quang Phan
Attorney, Agent, or Firm—Fleshner & Kim

[57] ABSTRACT

An improved sense amplifier output control circuit of a semiconductor memory device increases the operational speed and reduces possible noise. A sense amplifier senses a data read from a memory cell in accordance with a sense enable signal applied thereto. A Schmitt trigger circuit outputs the same level signal when the level difference between a data signal outputted from the sense amplifier and a data bar signal inverted from the data signal is below a predetermined value, and outputs a different level signal when the level difference is increased more than a predetermined value. A data latch circuit inverts and outputs an output signal outputted from the Schmitt trigger circuit in accordance with a latch enable signal inputted thereto. A data output buffer outputs the same level signal as a data signal outputted from the sense amplifier when a signal outputted from the data latch circuit has a different level in accordance with an output enable signal inputted thereto.

26 Claims, 6 Drawing Sheets

FIG.3A CONVENTIONAL ART   ADDRESS SIGNAL

FIG.3B CONVENTIONAL ART   SENSE ENABLE

FIG.3C CONVENTIONAL ART   SOUT

FIG.3F CONVENTIONAL ART   I/O PAD (0~7)

FIG.3G CONVENTIONAL ART   $\Delta V = L\frac{di}{dt}$

FIG. 5A ADDRESS SIGNAL

FIG. 5B SENSE ENABLE

FIG. 5E SOUT/SOUTB  ΔV

FIG. 5F N3/N4

FIG. 5G I/O PAD (0~7)

FIG. 5H  $\Delta V = L \frac{di}{dt}$

SENSE AMPLIFIED OUTPUT CONTROL CIRCUIT

TECHNICAL FIELD

The present invention relates to a sense amplifier output signal control circuit, and in particular, to a sense amplifier control circuit with a Schmitt trigger circuit.

BACKGROUND ART

Figure 1:
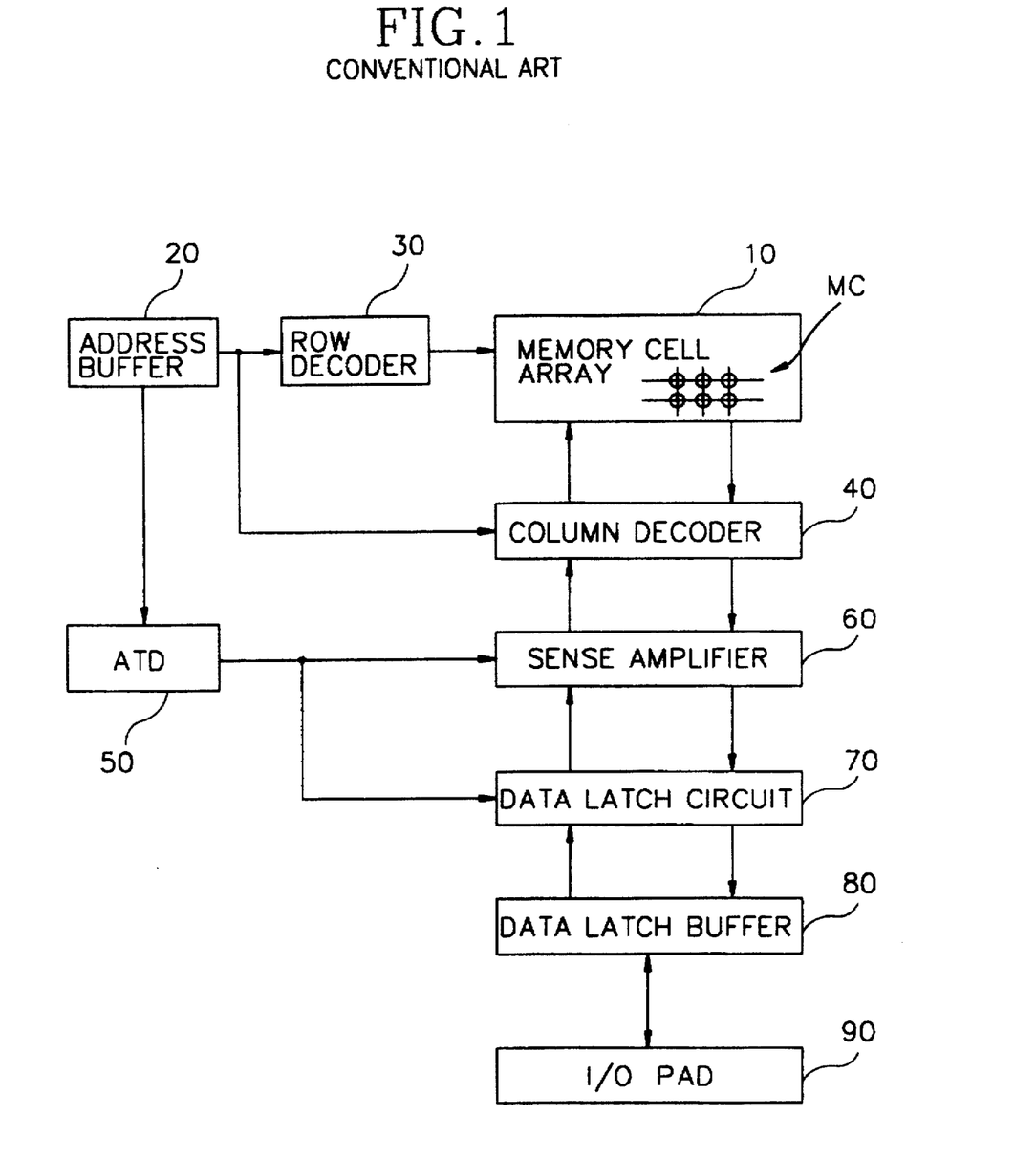
FIG. 1 is a block diagram of a conventional semiconductor memory device.

FIG. 1 is a general diagram of a storage or memory device (e.g., a semiconductor memory device), which includes a memory cell array 10 having a plurality of memory cells MC, for storing data, an address buffer 20 for buffering an input address, a row decoder 30 and column decoder 40 for selecting a memory cell of the memory cell array according to the output signal of the address buffer, a sense amplifier 60 for sensing the data outputted from the selected memory cell, a data latch circuit 70 for latching an output signal of the sense amplifier, a data output buffer 80 for buffering an output signal of the data latch circuit, input/output pads 90 for externally transmitting an output signal of the data output buffer 80, and an address transition detector 50 for detecting a transition of the signal outputted from the address buffer 20 and controlling an operation of the sense amplifier 60 and the data latch circuit 70.

Figure 2:
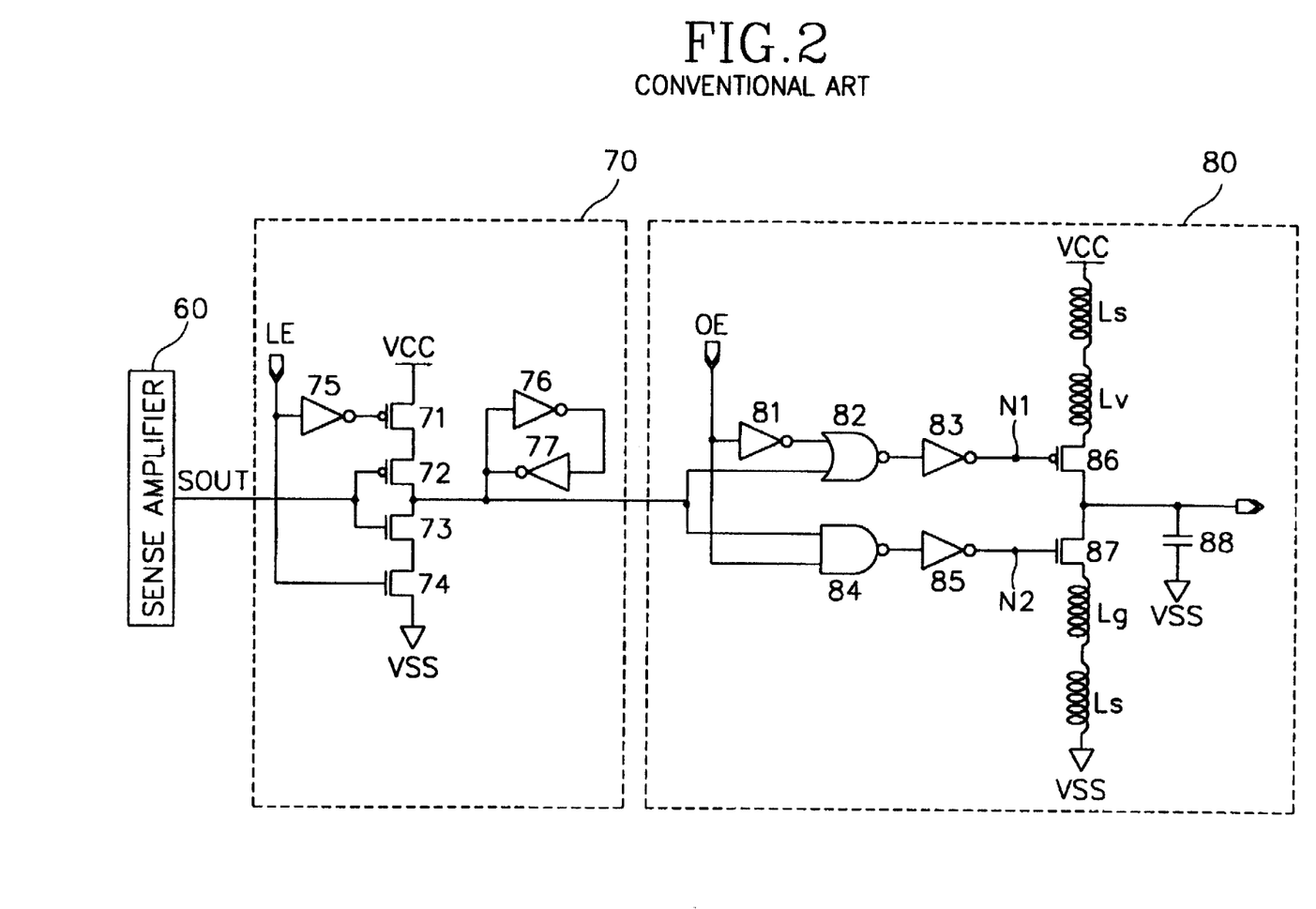
FIG. 2 is a circuit diagram of a conventional sense amplifier output control circuit.

FIG. 2 illustrates a detailed schematic of a sense amplifier output control circuit for controlling the output signals at the I/O pad 90. In the data latch circuit, PMOS transistors 71 and 72 and NMOS transistors 73 and 74 are connected between the supply voltage source and ground, and the output signal of the sense amplifier 60 is commonly applied to the gates of the PMOS transistor 72 and the NMOS transistor 73. A latch enable signal LE is applied to the gate of the NMOS transistor 74, while an inverted version of the latch enable signal LE due to the inversion at an inverter 75 is applied to the gate of the PMOS transistor 71. The Output signals of the MOS transistors 71–74 are outputted from a drain connection point, and the output signals are maintained by inverters 76 and 77, and outputted to the data output buffer 80.

The data output buffer 80 includes an inverter 81 for inverting an output enable signal OE, a NOR-gate 82 for NORing the output signals of the inverter 81 and the data latch circuit 70, and an inverter 83 for inverting the output signal of the NOR-gate 82. A NAND-gate 84 NANDs the output signals of an output enable signal OE and the data latch circuit 70, and an inverter 85 inverts the output signal of the NAND-gate 84. A PMOS transistor 86 and an NMOS transistor 87 are connected in series between the supply voltage source Vcc and ground Vss, and the output signals of the inverters 83, 85 are applied to the respective gates thereof.

The output terminal of the data output buffer 80 is connected to the drain connection point of the MOS transistors 86 and 87, and a load capacitor 88 is connected between the output terminal of the data output buffer 80 and ground- The data output buffer 80 also includes an inductance Ls generated by the socket of a semiconductor memory device, an inductance Lv generated by the lead frame and the bonding wire on the supply voltage source, and an inductance Lg generated by the lead frame and the bonding wire of ground.

Figures 3A, 3B:
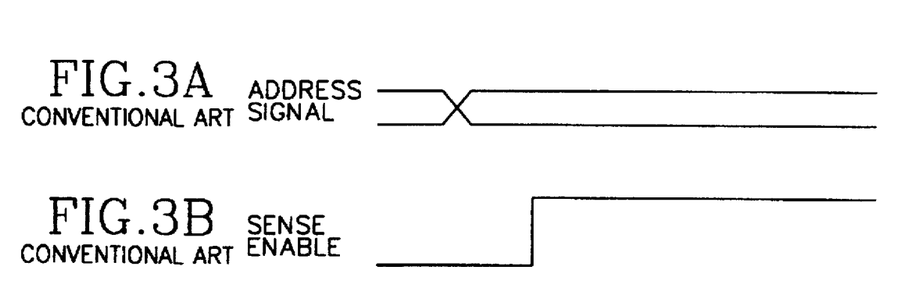
FIGS. 3A through 3G are waveforms of various signals of FIG. 2 circuit.
Figure 3C:
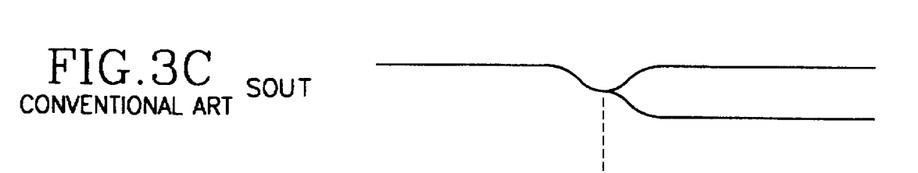
Figures 3D, 3E:
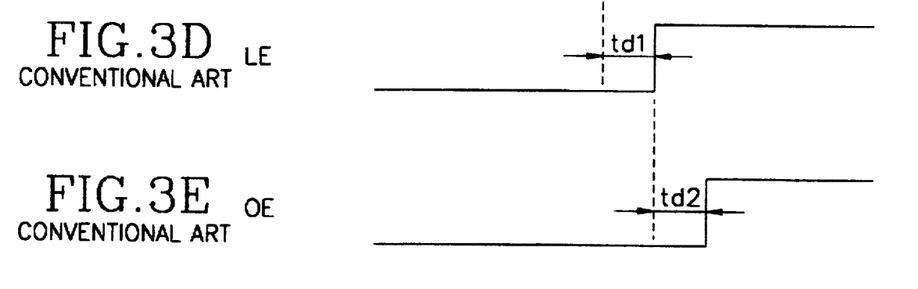

When the sense amplifier 60 is enabled, it outputs an output signal SOUT in accordance with an address transition detect signal inputted thereto. After a predetermined time td1 lapses (see FIG. 3), a latch enable signal LE becomes high, and the PMOS transistor 71 and the NMOS transistor 74 are turned on. Then, when the sense amplifier 60 outputs a high level signal SOUT, and the PMOS transistor 72 and NMOS transistor 73 are turned off and on, respectively, the data latch circuit 70 outputs a low level signal. But when the output signal SOUT of the sense amplifier 60 is low, and the PMOS transistor 72 is turned on, and the NMOS transistor 73 is turned off, the data latch circuit 70 outputs a high level signal. In other words, the MOS transistors 71–74 invert an output signal of the sense amplifier 60 and output the inverted signal of an output signal SOUT.

When the output enable signal OE becomes high level after a predetermined time td2 lapses after the latch enable signal LE is shifted to a high level, the electric potentials of the nodes N1 and N2 of the data output buffer 80 are determined in accordance with an output signal of the data latch circuit 70. When the output signal of the data latch circuit 70 is low level, and the output enable signal OE is high level, the electric potential at the nodes N1 and N2 of the data output buffer 80 is low level.

Since the PMOS transistor 86 is turned on, and the NMOS transistor 87 is turned off, the output terminal outputs a high level signal. On the other hand, when an output signal of the data latch circuit 70 is high level, and the output enable signal OE is high level, the electric potential at the nodes N1 and N2 of the data output buffer 80 is high level. The PMOS transistor 86 and NMOS transistor 87 are turned off and on, respectively, and the output terminal outputs a low level signal. Since the latch enable signal LE and the output enable signal OE become high level after the sense amplifier 60 is enabled, the output signal of the sense amplifier 60 is outputted through the data output buffer 80.

When the latch enable signal LE is high level, and the output enable signal OE is low level, the levels of the nodes N1 and N2 become high level and low level, respectively. Since the MOS transistors 86 and 87 of the data output buffer 80 are all turned off and electrically floating, the output terminal becomes a high level impedance. On the other hand, when the latch enable signal LE is low level, and since the MOS transistors are turned off, the output signal of the data latch circuit 70 is electrically floating. When the output enable signal OE becomes high level, and since the nodes N1 and N2 of the data output buffer 80 remain unchanged, the data output buffer 80 outputs the identical level of the previous data without any change. When the latch enable signal LE and the output enable signal OE are all low level, and since the nodes N1 and N2 become high level and low level, respectively, and the MOS transistors 86, 87 are turned off, the data output buffer 80 becomes a high level impedance.

The conventional sense amplifier output control circuit is disadvantageous since the output enable signal OE cannot be accurately controlled due to the delay time caused by the high-density memory, and a certain degree of margin is given to the signals. As shown in FIG. 3A, when an address signal is shifted, the sense amplifier 60 is enabled, as shown in FIG. 3B, and the output signal is outputted, as shown in FIG. 3C. As shown in FIG. 3D, the latch enable signal LE is shifted to a high level after a predetermined time td1 lapses after the output signal SOUT begins to be outputted from the sense amplifier 60, and the output enable signal OE, as shown in FIG. 3E, is shifted to a high level after a predetermined time td2 lapses again after the latch enable signal LE becomes high so that the latch enable signal LE can latch an effective data from the sense amplifier 60.

Figure 3F:
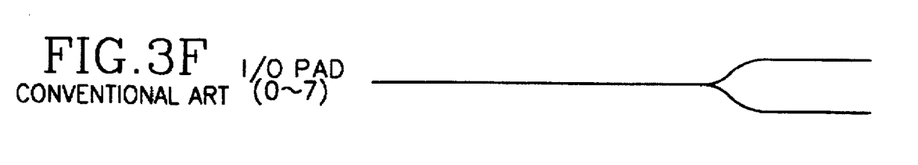
Figure 3G:
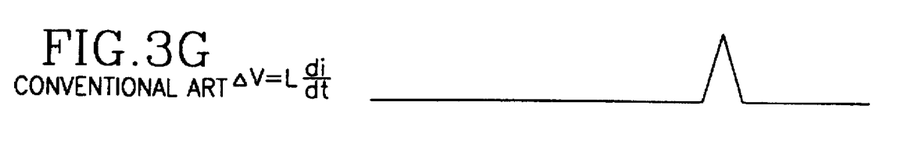

Since the output Signal SOUT of the sense amplifier 60 is outputted from the data output buffer 80 after the above-mentioned delay time "td1+td2", the output signal has a default of causing an operating speed penalty as shown in FIG. 3F. Meanwhile, when a data is outputted from the memory in a unit of eight (8) bits, eight of the sense amplifiers and the data output buffers are each adapted. Further, the signals inputted to the eight data output buffers 80 from the sense amplifiers 60 are at the same time outputted in accordance with one output enable signal OE, and a peak current is increased, as shown in FIG. 3G, causing noise.

DISCLOSURE OF THE INVENTION

An advantage of the present invention is in increasing the speed of a storage device.

Another advantage is in decreasing possible noise of a storage device.

To achieve the above advantages and others, there is provided a sense amplifier output control circuit for a semiconductor memory device, comprising: a sense amplifier for sensing a data read from a memory cell in accordance with a sense enable signal applied thereto; a Schmitt trigger circuit coupled td the sense amplifier, an output signal of the Schmitt trigger circuit remaining the same until a potential difference between a data signal and an inverted signal thereof is greater than a predetermined value; a latch circuit coupled to the Schmitt trigger such that the output signal of the Schmitt trigger is inverted in response to a first control signal; and an output buffer, responsive to a second control signal, for outputting the inverted output signal from the latch circuit, wherein the latch circuit and output buffer respond to the first and second control signals at substantially the same time.

A circuitry for controlling an output signal at an output terminal of a storage device, comprising: a sense amplifier for sensing a data read from a cell of the storage device; a Schmitt trigger circuit coupled to the sense amplifier to receive a data signal and an inverted data signal and to a first and second nodes, a first and second potential at the first and second nodes, respectively, remaining the same until a potential difference between the data and inverted data signals reach a predetermined value based on hysteresis characteristics of the Schmitt trigger circuit; a latch circuit coupled to the Schmitt trigger at the first and second nodes to output an inverted signal of the first and second potential at a third and fourth nodes, respectively; and an output buffer coupled to the third and fourth nodes and the output terminal such that the data signal is outputted at the output terminal.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 4A:
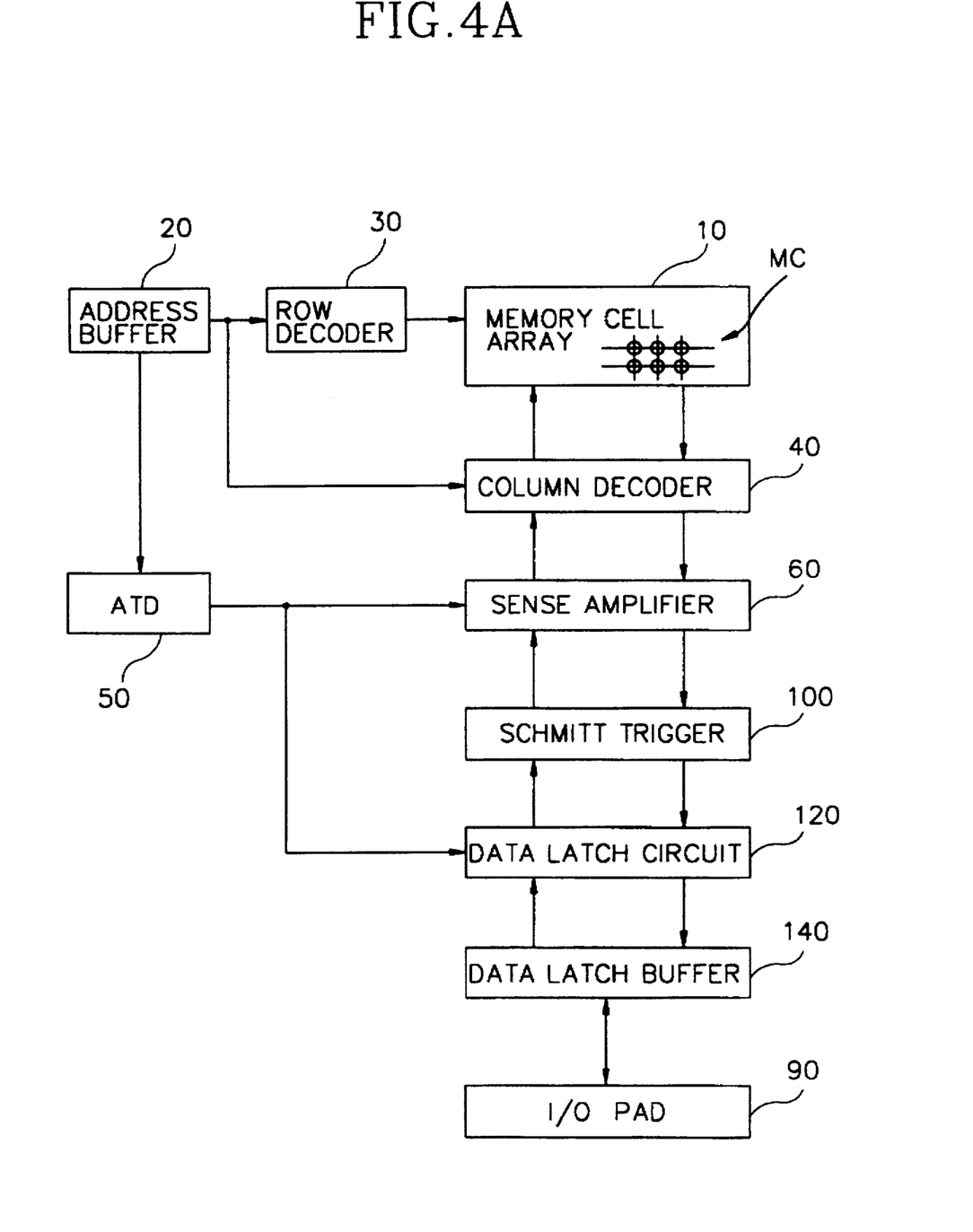
FIG. 4A is a circuit diagram of a storage device according to one embodiment of the present invention.

FIG. 4A shows a storage device, according to one embodiment of the invention, in which elements with identical reference numerals are similar to the elements identified in FIG. 1. However, FIG. 4A differs from FIG. 1 in the use of a modified data latch circuit 120 and a modified data output buffer circuit 140. In addition, the storage device in FIG. 4A differs from FIG. 1 in the inclusion of a Schmitt trigger circuit 100, located between the sense amplifier 60 and the data latch circuit 120. The sense amplifier 60, Schmitt trigger circuit 100, data latch circuit 120, and data output buffer 140 are collectively referred to as a sense amplifier output control circuit and will be described in detail with reference to FIG. 4B.

Figure 4B:
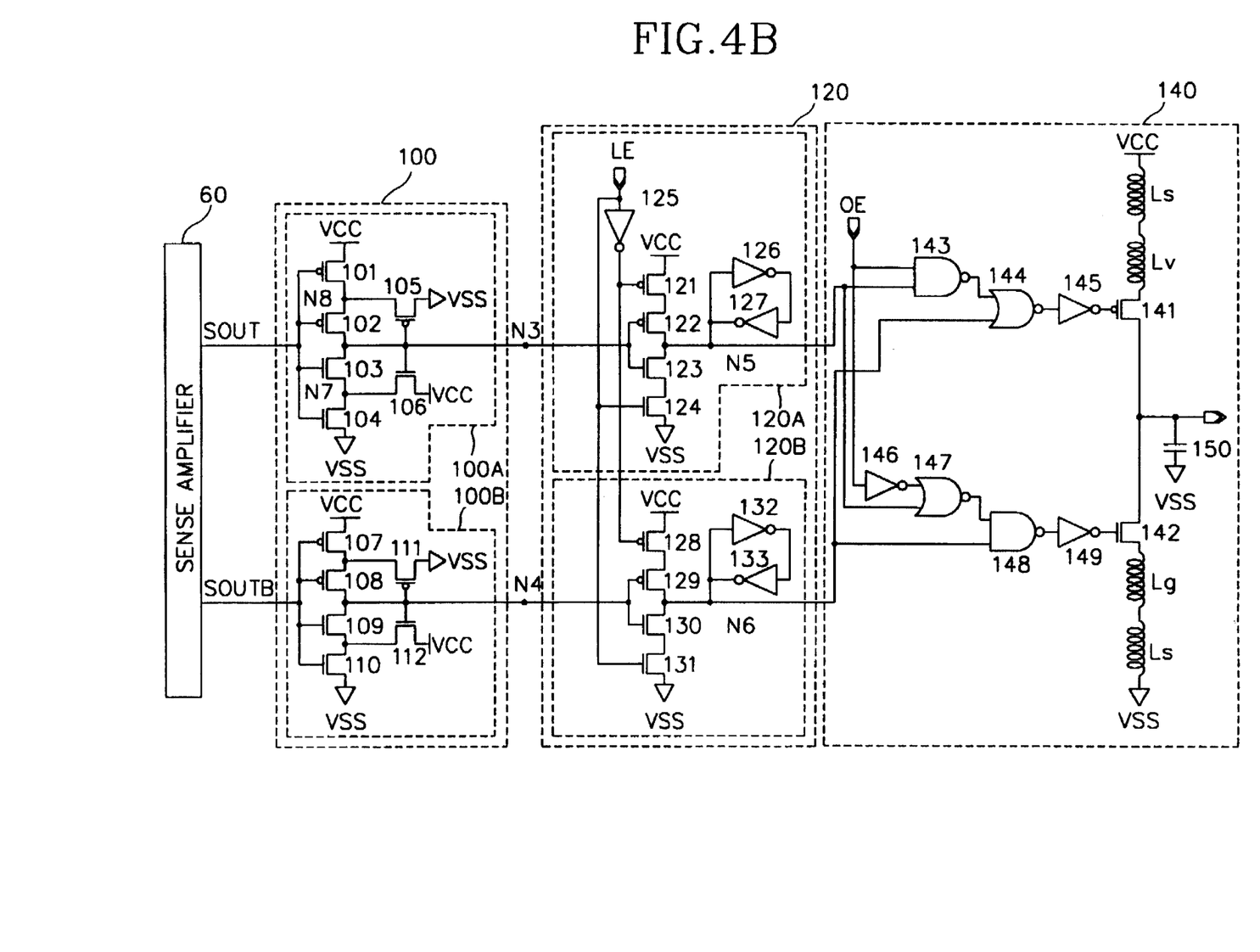
FIG. 4B is a circuit diagram of a sense amplifier output control circuit according to the present invention.

FIG. 4B illustrates a sense amplifier output control circuit including a Dense amplifier 60 a Schmitt trigger circuit 100, a data latch circuit 120, and a data output buffer 140. The Schmitt trigger circuit 100 has a first Schmitt trigger 100a, and second Schmitt trigger 100b. In the first Schmitt trigger 100a, PMOS transistors 101 and 102 and NMOS transistors 103 and 104 are connected in series between the supply voltage source Vcc and ground Vss. An output signal SOUT of the sense amplifier 60 is applied to the gate of the MOS transistors 101 through 104, and an output terminal N3 of the first Schmitt trigger 100a is connected to the drain connection point of the MOS transistors 102 and 103.

The source of the PMOS transistor 105 is connected to a drain-source connection point n8 of the MOS transistors 101 and 102; the drain of the PMOS transistor 105 is connected to ground circuit Vss; and the gate of the PMOS transistor 105 is connected to the output terminal N3. Further, the drain of NMOS transistor 106 is connected to the supply voltage source Vcc; the source of the NMOS transistor 106 is connected to a source-drain connection point n7 of the MOS transistors 103 and 104; and the gate of the NMOS transistor 106 is connected to the output terminal n3.

The second Schmitt trigger 100B is provided with the MOS transistors 107–112 which have the same construction as the MOS transistors 101–106 and an output terminal N4 which corresponds to N3. The data bar signal SOUTB is an inverted signal of the output signal SOUT of the sense amplifier 60, and is applied to the gate D of the MOS transistors 107–110.

The data latch circuit 120 has a first data latch 120A for inverting and outputting a signal of a node N3, and a second latch 120B for inverting and outputting a signal of the node N4. Each latch has the same construction as the data latch 70 as shown in FIG. 2.

The first data latch 120A includes an output terminal N5 and the second data latch 120B includes an output terminal N6.

The data output buffer 140 includes a PMOS transistor 141 and an NMOS transistor 142 which are connected in series between the supply voltage source Vcc and ground Vss. A NAND gate 143 NANDs a signal of node N6 and an output enable signal OE, and a NOR-gate 144 NORs an output signal of the NAND-gate 143 and an output signal of node N6. An inverter 145 inverts and applies an output signal of the NOR-gate 144 to gate of the PMOS transistor 141. An inverter 146 inverts an output enable signal OE, and NOR-gate 147 NORs output signals of the inverter 146 and a node N5. A NAND-gate 148 NANDs an output signal of the NOR-gate 147 and an output signal of node N6. An inverter 149 inverts an output signal of the NAND-gate 148 and applies an output signal of the NAND-gate 148 to the gate of the NMOS transistor 142. A load capacitor 150 is connected to the output terminal between the drain connection point of the MOS transistors 141 and 142 and the ground Vss.

First, the operation of the Schmitt trigger 100a will now be described. When voltage SOUT applied to the gate of the transistors 101-104 is a low level, since the PMOS transistors 101 and 102 are turned on, and the NMOS transistors 103-104 are turned off, the node N3 becomes high level. The PMOS transistor 105 and the NMOS transistor 106 with gates connected to the node N3 are turned off and turned on, respectively, and the level of node N7 becomes high level.

When the voltage SOUT is increased and goes beyond a threshold voltage, the transistors 103 and 104 are turned on, and the transistors 101 and 102 are turned off. Since the node N7 is still in a high level, the level of the output voltage of the node N3 remains a high level. When driving capacitance of the transistor 104 is continuously increased greater than that of the transistor 106 in accordance with the increased voltage SOUT, the voltage of the ground level applied to the source of the transistor 104 is supplied to the node N3, and the level of the output voltage becomes a low level.

When the voltage SOUT applied to the gates of the transistors 101 and 104 is a high level, node N3 becomes low level, since the NMOS transistors 103 and 104 are turned on, and the PMOS transistors 101 and 102 are turned off. The PMOS transistor 105 and the NMOS transistor 106 with gates connected to the node N3 are turned on and turned off, respectively, and thereby node N8 becomes a low level. When the level of the voltage SOUT is lowered, and goes below the threshold voltage of the transistors 101 and 102, the transistors 101 and 102 are turned on, and the transistors 103 and 104 are turned off.

Since the node N8 is still in a low level, the level of the output voltage at the node N3 remains a low level. When the voltage SOUT is continuously lowered, and the driving capacitance of the transistor 101 becomes bigger than that of the transistor 105, the voltage supplied to the source of the transistor 101 is supplied to the node N3, and the level of the output voltage finally becomes a high level.

In the conventional inverter, when the input voltage is changed from low level to high level, a predetermined output voltage VI is changed from high to low. But, in the Schmitt trigger 100a, unlike the above-mentioned conventional inverter, although the input voltage is changed from low to high, the output voltage VI is changed from low to high in the level of "VI+$\Delta$V" in which the level of the input voltage is higher than VI. On the contrary, although the input voltage is changed from high to low, the output voltage is changed from low to high in the level of "VI-$\Delta$V" in which the level of the input voltage is lower than VI. Therefore, the Schmitt trigger 100a has an hysteresis characteristic that the voltage of the Schmitt trigger 100a has a width of "$\Delta$V=-dV or +dV" more, compared with a general inverter. That is, while the input voltage is in the level of "VI±dV", in other words, while the level of the input voltage is unstable, the output voltage is not changed, but when the level of the input voltage is increased or decreased over the level or below the level of "VI±dV", and the level of the input voltage becomes stable, the output voltage is changed. Therein, a value of $\Delta$V can be achieved by controlling the driving capacitance of the PMOS transistors 101 and 105 and the NMOS transistors 104 and 106.

Figure 5A:
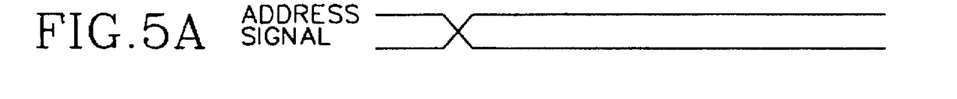
FIGS. 5A through 5H are waveforms of various signals of FIG. 4B circuit.
Figure 5B:
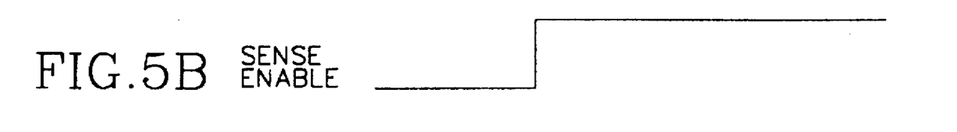
Figure 5C:
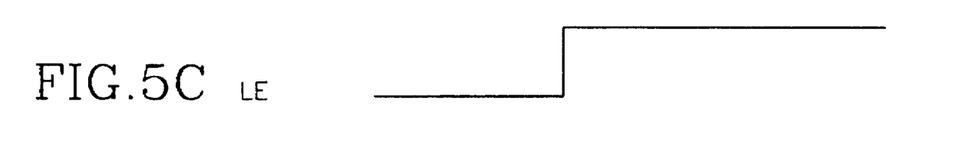
Figure 5D:
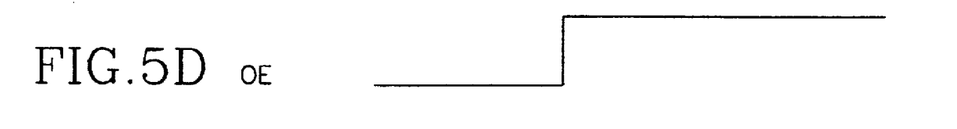

In the present invention provided with the Schmitt trigger characterized by the above-described features, when an address signal, as shown in FIG. 5A, is shifted, and the sense enable signal is shifted to a high level, as shown in FIG. 5B, the latch enable-signal LE and the output enable signal OE are shifted to a high level at the same time without any delay as shown in FIGS. 5C and 5D. When the sense amplifier 60 is enabled, the output signals SOUT and SOUTB of the sense amplifier 60 maintaining the level of the supply voltage source is equalized to a level of ½Vcc. Until the output signals SOUT and SOUTB of the sense amplifier 60 maintain a high level and a level of ½Vcc, the Schmitt triggers 100a and 100b all output low level signals.

The nodes N5 and N6 become high level in accordance with the PMOS transistors 121, 122, 128, and 129, which are turned on in accordance with low .level signals outputted from the nodes N3 and N4 in the data latch circuit 120. When the signals outputted from the nodes N5 and N6 are all high or all low, the data output buffer 140 becomes a high level impedance. Therefore, since the high-level and low-level signals are respectively applied to the gates of MOS transistors 141 and 142 in accordance with output signals of the nodes N5 and N6, each having a high level, the data output buffer 140 becomes a high level impedance.

However, after the equalization is completed, a level difference appears between the values of the two output signals SOUT and SOUTB of the sense amplifier 60, as shown in FIG. 5A. When the level of one output signal SOUT of the sense amplifier starts to be changed to a high level, and the other output signal SOUTB starts to be changed to a low level, the output signal of the Schmitt trigger circuit-100 is not changed in accordance with the hysteresis characteristic until the level difference between the two output signals is increased more than $\Delta$V.

Figure 5E:
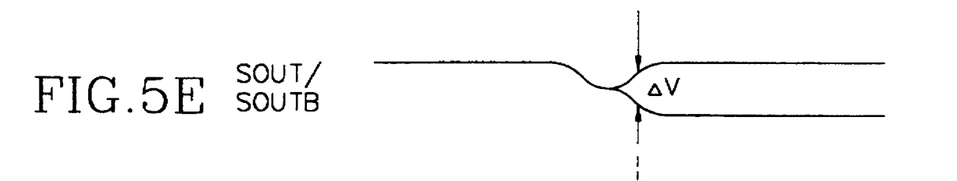
Figure 5F:
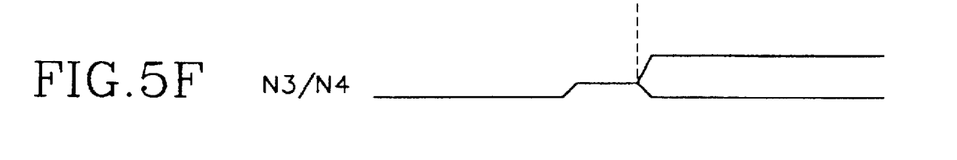

Once the level difference is increased more than $\Delta$V, the Schmitt trigger 100 functions as an inverter. The Schmitt trigger 100a, to which the output signal SOUT changed to a high level is inputted, outputs a low level signal. The Schmitt trigger 100b, to which the output signal SOUTB changed to a low level is inputted, outputs a high level signal, so that the level of the node N3 becomes a low level, and the node N4 becomes a high level as shown in FIG. 5F.

In the data latch circuit 120, the first latch 120A and the second latch 120b work as an inverter, and the first latch 120a outputs a high level signal and the second latch 120b outputs a low-level signal. Thereafter, in the data output buffer 140, when an output signal of the data latch circuit 120, which is high and low, is inputted to the NAND-gates 143 and 148, respectively, the PMOS transistor 141 is turned on, and the NMOS transistor 142 is turned off, and then the output buffer 140 outputs a high level signal.

On the other hand, when one output signal SOUT of the sense amplifier 60 is changed to low level, and the other output signal SOUTB is changed to high level, the Schmitt trigger 100a, to which the output signal SOUT changed to a low level is inputted in case the level difference between the two output signals SOUT and SOUTB is increased more than $\Delta$V, outputs a high level signal. The Schmitt trigger 100b, to which the output signal SOUTB changed to a high level is inputted, outputs a low level signal.

In the data latch circuit 120, the first latch 120a outputs a low level signal, and the second latch 120b outputs a high level signal. In the data output buffer 140, when the output signals of the data latch circuit 120, which is in a low level and a high level, is inputted t0 the NAND gates 143 and 148, respectively, the PMOS transistor 141 is turned off, and the NMOS transistor 142 is turned on. Hence, the data output buffer 140 outputs a low level signal.

When a high level latch enable signal LE and a high level output enable signal OE are applied to a corresponding element, the output signal of the sense amplifier 60 is made stable, and the level difference between the two output signals SOUT and SOUTB is increased more than a predetermined value ΔV, and the data output buffer 140 starts to operate. As shown in FIGS. 5D and 5E, since the latch enable signal LE and the output enable signal OE need no predetermined delay time td1 and td2 to get an effective data, the operation speed of the present invention is made faster.

Figure 5G:
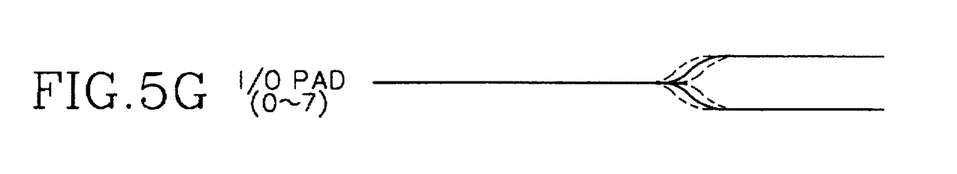
Figure 5H:
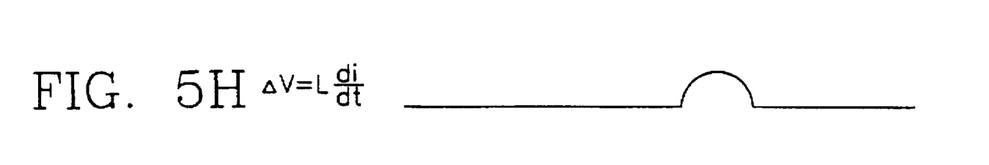

Also, when eight sense amplifiers 60 and eight data output buffers 140 are provided, the eight data output buffers 140 are not operated in accordance with an output enable signal OE applied thereto at the same time, but the data output buffer connected to the sense amplifier 60, of which the level difference between the two output signals is first increased by ΔV, starts first to operate. Therefore, as illustrated in FIG. 5G, the operating time of the eight data output buffers are determined in accordance with the output signal of the sense amplifiers 60 connected to the corresponding data output buffers 140. Therefore, in the present invention, since the peak current generated by the data output buffer 140 is distributed to the data output buffers of which each operating time is different, the operating time is reduced, as shown in FIG. 5H, and accordingly, the present invention comes to have the effect of reducing noise.

Although the preferred embodiments of the present invention have been disclosed for illustrative purposes, those skilled in the art will appreciate that various modifications, additions and substitutions are possible, without departing from the scope and spirit of the invention as described in the accompanying claims.

We claim:

1. A sense amplifier output control circuit for a semiconductor memory device, comprising:

a sense amplifier for sensing a data read from a memory cell in accordance with a sense enable signal applied thereto and producing a data signal and an inverted data signal thereof;

a Schmitt trigger circuit coupled to said sense amplifier, an output signal of said Schmitt trigger circuit remaining the same until a potential difference between the data signal and the inverted data signal is greater than a predetermined value;

a latch circuit coupled to said Schmitt trigger such that the output signal of said Schmitt trigger is inverted in response to a first control signal to produce an inverted output signal; and an output buffer, responsive to a second control signal, for outputting the inverted output signal from the latch circuit, wherein said latch circuit and said output buffer respond to said first control signal and said second control signal, respectively at substantially the same time.

2. The circuit of claim 1, wherein said Schmitt trigger circuit includes:

a first Schmitt trigger for inverting the data signal from said sense amplifier in accordance with a first predetermined value of a first hysteresis characteristic; and a second Schmitt trigger for inverting the inverted data signal from said sense amplifier in accordance with a second predetermined value of a second hysteresis characteristic.

3. The circuit of claim 2, wherein said first Schmitt trigger includes:

first and second PMOS transistors and first and second NMOS transistors connected in series between supply voltage source and ground, and gates of said first and second PMOS and NMOS transistors receive the data signal outputted from the sense amplifier;

a third PMOS transistor having a drain connected to ground, a source connected to a drain-source connection point of said first and second PMOS transistors, and a gate connected to a first output terminal of said first Schmitt trigger;

a third NMOS transistor having a drain connected to the supply voltage source, a source connected to a drain-source connection point of said first and second NMOS transistors, and a gate connected to said first output terminal.

4. The circuit of claim 3, wherein the first predetermined value of the first hysteresis characteristic directed to change a first Schmitt output signal of the first output terminal from a low level to a high level when a level of the data signal outputted from the sense amplifier is changed from high to low is determined in accordance with a driving capacitance of the first PMOS transistor and the third PMOS transistor.

5. The circuit of claim 3, wherein the first predetermined value of the first hysteresis characteristic directed to change a first Schmitt output signal of the first output terminal from high to low when the data signal outputted from the sense amplifier is changed from low into high is determined in accordance with a driving capacitance of the second NMOS transistor and the third NMOS transistor.

6. The circuit of claim 3, wherein said second Schmitt trigger, having the same construction as said first Schmitt trigger, has the second hysteresis characteristic such that a second Schmitt output signal lowers a voltage which is changed from low to high up to the second predetermined value when the inverted data signal outputted from the sense amplifier is changed from high to low, and has the second hysteresis characteristic such that said second Schmitt output signal enhances a voltage which is changed from high to low up to the second predetermined value when said inverted data signal is changed from low to high.

7. The circuit of claim 2, wherein said data latch circuit includes a first latch and a second latch for respectively inverting a first and second Schmitt output signals of the first and second Schmitt triggers, and outputting a first and second latch output signal to the output buffer in accordance with the first control signal inputted thereto.

8. The circuit of claim 7, wherein said output buffer includes:

a first NAND gate for NANDing the second control signal and the first latch output signal of the first latch;

a first NOR gate for NORing an output signal of said first NAND gate and the second latch output signal of said second latch;

a first inverter for inverting an output signal of said first NOR gate;

a PMOS transistor having a source connected to the supply voltage source, and a gate for receiving an output signal of said first inverter;

a second NOR gate for NORing an inverted second control signal and a first latch output signal of said first latch;

a second NAND gate for NANDing an output signal of said second NOR gate and a second latch output signal of said second latch;

a second inverter for inverting an output signal of said second NAND gate; and an NMOS transistor having a source connected to ground circuit, a drain connected to an output terminal of the output buffer, and a gate for receiving an output signal of said second inverter.

9. A circuitry for controlling an output signal at an output terminal of a storage device, comprising:

a sense amplifier for sensing a data read from a cell of the storage device and outputting a data signal and an inverted data signal;

a Schmitt trigger circuit coupled to said sense amplifier to receive the data signal and the inverted data signal and coupled to first and second nodes, a first and a second potential at said first and second nodes, respectively, remaining the same until a potential difference between the data and inverted data signals reach a predetermined value based on a hysteresis characteristic of said Schmitt trigger circuit;

a latch circuit coupled to said Schmitt trigger at said first and second nodes to output an inverted signal of the first and second potential at a third and fourth nodes, respectively; and an output buffer coupled to the latch circuit at the third and fourth nodes and coupled to the output terminal such that the data signal is outputted at the output terminal.

10. The circuitry of claim 9, wherein said Schmitt trigger circuit includes a first Schmitt trigger having:

a first plurality of transistors coupled in series, each gate receiving the data signal, and one of a first drain source connection of said first plurality of transistors being coupled to the first node; and a first pair of transistors coupled to the first node, wherein said first Schmitt trigger has a hysteresis characteristic based on a driving capacitance one of said first plurality of transistors and said first pair of transistors.

11. The circuitry of claim 10, wherein said first plurality of transistors comprises a first and second PMOS transistors and first and second NMOS transistors coupled in series, and said first pair of transistors comprises a third PMOS transistor and a third NMOS transistor.

12. The circuitry of claim 11, wherein said first potential at said first node remains the same during a transition of said data signal from low to high until the driving capacitance of said second NMOS transistor is greater than said third NMOS transistor.

13. The circuitry of claim 11, wherein said first potential at said first node remains the same during a transition of said data signal from high to low until the driving capacitance of said first PMOS transistor is greater than said third PMOS transistor.

14. The circuitry of claim 9, wherein said Schmitt trigger circuit included a second Schmitt trigger having:

a second plurality of transistors coupled in series, each gate receiving the inverted data signal, and one of a second drain source connection of said second plurality of transistors being coupled to the second node; and a second pair of transistors coupled to the second node, wherein said second Schmitt trigger has a hysteresis characteristic based on a driving capacitance of one of said second plurality of transistors and said second pair of transistors.

15. The circuitry of claim 14, wherein said second plurality of transistors comprises a first and second PMOS transistors and a first and second NMOS transistors coupled in series, and said second pair of transistors comprises a third PMOS transistor and a third NMOS transistor.

16. The circuitry of claim 15, wherein said second potential at said second node remains the same during a transition of said inverted data signal from low to high until the driving capacitance of said second NMOS transistor is greater than said third NMOS transistor.

17. The circuitry of claim 15, wherein said second potential at said second node remains the same during a transition of said inverted data signal from high to low until the driving capacitance of said first PMOS transistor is greater than said third PMOS transistor.

18. A storage device comprising:

a) a memory device having a plurality of memory cells; and b) means for at least one of reading and writing operation, said means having i) a sense amplifier for sensing a data read from a cell of the memory device, ii) a Schmitt trigger circuit coupled to said sense amplifier to receive a data signal and an inverted data signal and to a first and second nodes, a first and second potential at said first and second nodes, respectively, remaining the same until a potential difference between the data and inverted data signals reach a predetermined value based on hysteresis characteristics of said Schmitt trigger circuit, iii) a latch circuit coupled to said Schmitt trigger at said first and second nodes to output an inverted signal of the first and second potential at a third and fourth nodes, respectively, and iv) an output buffer coupled to the third and fourth nodes and the output terminal such that the data signal is outputted at the output terminal.

19. The circuitry of claim 18, wherein said Schmitt trigger circuit included a first Schmitt trigger having:

a first plurality of transistors coupled in series, each gate receiving the data signal, and one of a first drain source connection of said first plurality of transistors being coupled to the first node; and a first pair of transistors coupled to the first node, wherein said first Schmitt trigger has a hysteresis characteristic based on a driving capacitance one of said first plurality of transistors and said first pair of transistors.

20. The circuitry of claim 19, wherein said first plurality of transistors comprises a first and second PMOS transistors and first and second NMOS transistors coupled in series, and said first pair of transistors comprises a third PMOS transistor and a third NMOS transistor.

21. The circuitry of claim 20, wherein said first potential at said first node remains the same during a transition of said data signal from low to high until the driving capacitance of said second NMOS transistor is greater than said third NMOS transistor.

22. The circuitry of claim 20, wherein said first potential at said first node remains the same during a transition of said data signal from high to low until the driving capacitance of said first PMOS transistor is greater than said third PMOS transistor.

23. The circuitry of claim 18, wherein said Schmitt trigger circuit included a second Schmitt trigger having:

a second plurality of transistors coupled in series, each gate receiving the inverted data signal, and one of a second drain source connection of said second plurality of transistors being coupled to the second node; and a second pair of transistors coupled to the second node, wherein said second Schmitt trigger has a hysteresis characteristic based on a driving capacitance of one of said second plurality of transistors and said second pair of transistors.

24. The circuitry of claim 23, wherein said second plurality of transistors comprises a first and second PMOS transistors and a first and second NMOS transistors coupled in series, and said second pair of transistors comprises a third PMOS transistor and a third NMOS transistor.

25. The circuitry of claim 24, wherein said second potential at said second node remains the same during a transition of said inverted data signal from low to high until the driving capacitance of said second NMOS transistor is greater than said third NMOS transistor.

26. The circuitry of claim 24, wherein said second potential at said second node remains the same during a transition of said inverted data signal from high to low until the driving capacitance of said first PMOS transistor is greater than said third PMOS transistor.

* * * * *